US006863965B2

United States Patent
Fujinawa et al.

(10) Patent No.: US 6,863,965 B2
(45) Date of Patent: Mar. 8, 2005

(54) OPTICAL COMPONENT

(75) Inventors: Jun Fujinawa, Kanagawa (JP); Junji Nakada, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/151,173

(22) Filed: May 21, 2002

(65) Prior Publication Data
US 2003/0008122 A1 Jan. 9, 2003

(30) Foreign Application Priority Data

May 22, 2001 (JP) ........................... 2001-152307
May 23, 2001 (JP) ........................... 2001-153424

(51) Int. Cl.$^7$ ............................. B32B 7/02; G02B 1/11
(52) U.S. Cl. ..................... 428/215; 359/581; 359/582; 359/586; 359/587; 428/216; 428/336; 428/412; 428/451; 428/521; 428/522; 428/523
(58) Field of Search ................... 359/581, 582, 359/586, 587; 428/215, 216, 336, 412, 451, 521, 522, 523

(56) References Cited

U.S. PATENT DOCUMENTS 4,196,246 A * 4/1980 Takayama et al. .......... 428/213

* cited by examiner

Primary Examiner—D. S. Nakarani
(74) Attorney, Agent, or Firm—Sughrue Mion, PLLC

(57) ABSTRACT

This optical component includes a film formation substrate made of plastic, a magnesium fluoride film formed at an upper side of the film formation substrate and a first silicon oxide film formed on the magnesium fluoride film. The magnesium fluoride film may be formed on a surface of the film formation substrate. Alternatively, the optical component further may include a second silicon oxide film formed on a surface of the film formation substrate and between the film formation substrate and the magnesium fluoride film. The optical component can be realized, which is excellent in film adhesiveness, mechanical strength, drug resistance, environment resistance, and the like, as well as optical characteristics, and which is also excellent in productivity, film formation operability, cost, and the like.

22 Claims, 2 Drawing Sheets

OPTICAL COMPONENT

BACKGROUND OF THE INVENTION

1. Field of the Invention

The present invention relates to an optical component such as a lens. More specifically, the present invention relates to an optical component that has satisfactory low light-reflection, and a simple structure with a good outstanding strength, and in addition is excellent in terms of cost and productivity.

2. Description of the Related Art

Magnesium fluoride has been widely used as a material for a light reflection preventing film of various optical components such as a lens due to its inexpensiveness and low refractive index.

In an optical component, a reflection preventing film made of magnesium fluoride is generally formed on an optical component by vacuum deposition. However, an optical component itself absorbs moisture, so that the following is known: in order to obtain a reflection preventing film with sufficient strength as well as optical characteristics, excluding such an adverse effect, it is required to heat an optical component to high temperature (about 200° C. to 300° C.) during film formation (so-called "heating of a substrate") so as to evaporate moisture.

As a material for an optical component, glass has conventionally been used. Glass has sufficient heat resistance against the above-mentioned high temperatures. Therefore, there is no problem in forming a magnesium fluoride film by conducting the above-mentioned high-temperature treatment.

On the other hand, recently, an optical component made of plastic has been used due to its light weight, low cost, and excellent productivity. However, as is well known, a plastic material for an optical component generally does not have sufficient heat resistance to the above-mentioned temperatures, so that it is impossible to form a film with such a high-temperature treatment. Furthermore, an attempt has been made to form a magnesium fluoride film by heating the material to a heat-resistant temperature of plastic (about 70° C. to 90° C.). Nonetheless, a product with sufficient characteristics (in particular, strength) has not yet been obtained.

In contrast, various methods have been proposed for forming a reflection preventing film made of magnesium fluoride with satisfactory mechanical strength on an optical component made of plastic without performing a high-temperature treatment. Examples of the film formation method include: ion-assisted deposition (IAD) in which a substrate is cleaned by irradiation with ions; an ion plating method intended for improving film quality by ionizing a substrate; vacuum deposition in a high vacuum state; vacuum deposition while irradiating a substrate with electron beams; vacuum deposition in which a vaporized film material is allowed to pass through a plasma region; a vacuum deposition by using cluster ion beams, and the like.

However, the above-mentioned methods have disadvantage in various aspects such as productivity, operability of film formation, and a cost.

Furthermore, there is a technique for forming a low reflection film with a multi-layer structure (multi-coat) in which films made of materials having various refractive indexes are combined. Similarly, such a technique has disadvantage in terms of productivity, a cost, and a yield.

SUMMARY OF THE INVENTION

Therefore, with the foregoing in mind, it is an object of the present invention to solve the problems of the prior art and to provide an optical component which includes a substrate made of plastic that has light weight, low cost, excellent productivity and a magnesium fluoride film formed thereon as a reflection preventing film; which has superior adhesiveness, mechanical strength, drug resistance, environment resistance, and the like as well as simple structure and excellent optical characteristics; and which is also excellent in productivity, operability of film formation, a costs and the like.

In order to attain the object described above, the present invention provides an optical component, comprising: a film formation substrate made of plastic; a magnesium fluoride film formed at an upper side of the film formation substrate; and a first silicon oxide film formed on the magnesium fluoride film.

Preferably, the magnesium fluoride film is formed on a surface of the film formation substrate.

The present invention provides the optical component described above further comprises: a second silicon oxide film formed on a surface of the film formation substrate and between the film formation substrate and the magnesium fluoride film.

In each optical component described above, it is preferable that the film formation substrate is one selected from the group consisting of a lens, a filter, a screen, a polymer film, and an optical substrate.

It is another preferable that a thickness of the magnesium fluoride film is in a range of 40 nm to 160 nm, more preferably 50 nm to 140 nm, most preferably 60 nm to 120 nm.

It is further preferable that a thickness of the first and second silicon oxide films are in a range of 3 nm to 50 nm, more preferably 3 nm to 30 nm, most preferably 4 nm to 12 nm.

Preferably, the magnesium fluoride film is made of $MgF_2$ and the first and second silicon oxide films are made of $SiO_2$.

Preferably, a film formation material for the magnesium fluoride film has a refractive index "n" of 1.3 to 1.4, and a film formation material for the first and second silicon oxide films have a refractive index "n" of 1.4 to 1.5.

Preferably, the magnesium fluoride film, the first and second silicon oxide films are formed by vacuum deposition, respectively.

Preferably, the magnesium fluoride film, the first and second silicon oxide films are formed by vacuum deposition at a low temperature, respectively.

It is still further preferable that the low temperature is in a range of 20° C. to 50° C., more preferably 20° C. to 40° C., most preferably 20° C. to 30° C.

These and other advantages of the present invention will become apparent to those skilled in the art upon reading and understanding the following detailed description with reference to the accompanying drawings.

DESCRIPTION OF THE PREFERRED EMBODIMENTS

Hereinafter, the optical component of the present invention will be described in detail by way of preferred embodiments with reference to the drawings.

First, an optical component of the first embodiment of the present invention will be described.

Figure 1:
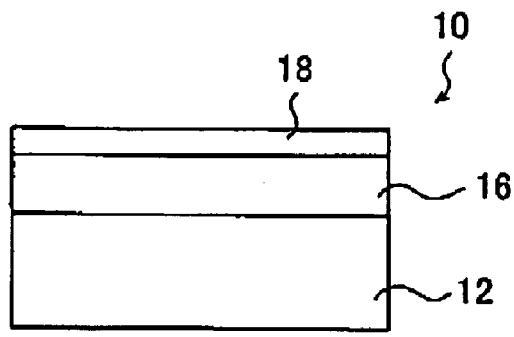
FIG. 1 shows a schematic view of an example of an optical component according to a first embodiment of the present invention.

FIG. 1 is a schematic view showing an example of an optical component of the first embodiment of the present invention.

An optical component 10 of the first embodiment of the present invention includes a base member 12 to be a film formation substrate, a magnesium fluoride film 16 (hereinafter, referred to as a "MgF film 16") formed on the surface of the base member 12, and a silicon oxide film 18 formed on the surface of the magnesium fluoride film 16.

According to the present invention, there is no particular limit to the base member 12, and various known optical components can be used. Examples thereof include various lenses, various filters, various screens, polymer films, optical substrates, and the like.

Furthermore, there is no particular limit to a material for the base member 12, and all the plastics (resin materials) used for optical components can be used. Preferred examples thereof include PMMA (polymethylmethacrylate), PC (polycarbonate), polyolefine, polyvinyl chloride, polystyrene, and the like. As the polymer film, in addition to the above materials, a polyester film, a polyetherimide film, a polyarylate film, a polyethersulfin film, and the like are also preferable.

The MgF film 16 is formed on the surface of the base member 12. The MgF film 16 is a thin film made of magnesium fluoride formed as a reflection preventing film for various kinds of optical components.

There is no particular limit to the thickness of the MgF film 16. In terms of optical characteristics (mainly, (light) reflection-preventing property and light transparency), productivity, cost, color tint (particularly, in the case of a lens), and the like, a preferred thickness is in a range of 40 nm to 160 nm, particularly from 50 nm to 140 nm, and more particularly from 60 nm to 120 nm.

A silicon oxide film 18 is formed on the surface of the MgF film 16. The silicon oxide film 18 is made of silicon oxide represented by General Formula: $SiO_x$ ($1.5 \leq x \leq 2$).

In the optical component 10 of the present invention, the silicon oxide film 18 is formed on the MgF film 16 that functions as a reflection preventing film. Therefore, an optical component of high quality is realized with a simple configuration and a simple structure, which is excellent in mechanical strength, adhesiveness of a film, drug resistance, and the like, as well as optical characteristics, which can maintain these properties even after being exposed to a severe environment, and in which the advantage of the MgF film 16 is exhibited.

There is no particular limit to the thickness of the silicon oxide film 18. However, in terms of optical characteristics, mechanical strength, drug resistance, color tint (particularly, in the case of a lens), permeability of oxygen and moisture, and the like, a thickness of 3 nm to 50 nm (in particular, from 3 nm to 30 nm, and especially from 4 nm to 12 nm) is preferable.

In the optical component 10 of the present invention, it is preferable that the MgF film 16 and the silicon oxide film 18 are formed by vacuum deposition. In particular, it is preferable that these films are formed by vacuum deposition at a low temperature. Preferred conditions thereof will be described later.

Various kinds of materials can be used for forming a magnesium fluoride film and a silicon oxide film. $MgF_2$ and $SiO_2$ are preferably used for the MgF film 16 and the silicon oxide film 18, respectively. It is also preferable that a material with a refractive index (n) of 1.3 to 1.4 is used for the MgF film 16, and a material with a refractive index (n) of 1.4 to 1.5 is used for the silicon oxide film 18, respectively.

Figure 2:
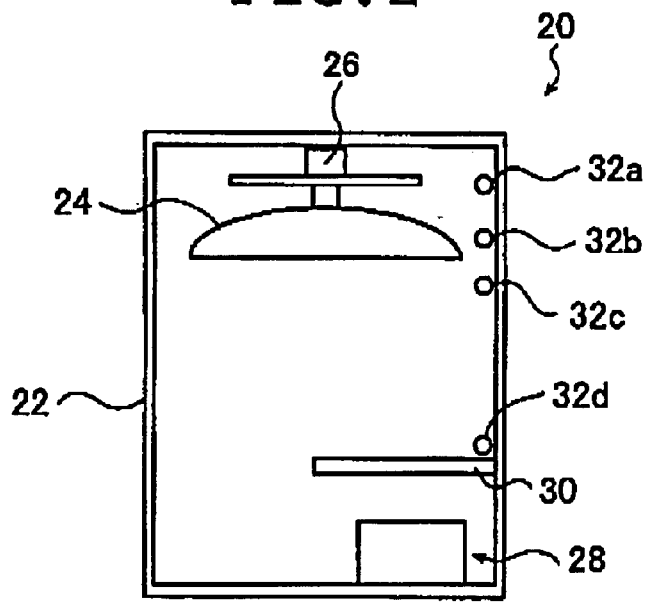
FIG. 2 shows a schematic view of an embodiment of a film formation apparatus for producing the optical component of the present invention.

FIG. 2 is a schematic view of a film formation apparatus for forming the MgF film 16 and the silicon oxide film 18 on the optical component 10 of the present invention.

The film formation apparatus 20 shown in FIG. 2 is basically a known vacuum deposition apparatus that is generally used. The film formation apparatus 20 includes a (vacuum) chamber 22, a rotation dome 24 suspended from a ceiling surface of the chamber 22, which holds a base member 12 to be a film formation substrate (or a holder holding the base member 12) and is rotated at a predetermined speed, a rotation unit 26 for the rotation dome 24, an electron gun evaporation source 28 on which a hearth for accommodating a film formation material and an electron gun are set, a shutter 30 for shielding vapor of the film formation material from the electron gun evaporation source 28, and an exhaust unit (not shown) for evacuating the chamber 22.

Furthermore, the film formation apparatus 20 shown in FIG. 2 includes four temperature measuring units 32 (32a, 32b, 32c, and 32d), and a temperature measuring unit of the base member 12 (not shown). The temperature measuring units 32 are placed so that measuring portions are in contact with the surface of an inner wall of the chamber 22, and preferably disposed, as shown in FIG. 2, in the vicinity of upper, side and lower portions of the rotation dome 24 (holding unit of the base member 12), and in the vicinity of an upper portion of the shutter 30.

As each of the temperature measuring units 32, a known unit such as a thermocouple may be used. Furthermore, as the temperature measuring unit of the base member 12, a known unit such as a radiation thermometer may be used.

Hereinafter, a method for producing the optical component 10 of the present invention by forming the MgF film 16 and the silicon oxide film 18 on the base member 12 by the film formation apparatus 20 will be described by way of a preferable example.

First, the base member 12 is set at a holder provided at a predetermined position of the rotation dome 24, and a hearth accommodating a film formation material (e.g., $MgF_2$) of the MgF film 16 and a hearth accommodating a film formation material (e.g., $SiO_2$) of the silicon oxide film 18 are set at a predetermined position of the electron gun evaporation source 28.

Herein, it is preferable that the base member 12 is diselectrified immediately after film formation, is allowed to stand still for about 1 to 3 days in an environment at 30° C. and 60% RH or less, and is diselectrified again before film formation. By subjecting the base member 12 to such a treatment, preferable results such as an enhanced yield due to the suppression of deposition of foreign matter such as dust can be obtained.

After the above-mentioned setting is completed, $MgF_2$ accommodated in the hearth set in the electron gun evaporation source 28 is preferably melted.

$MgF_2$ is generally provided in a granulated shape with a diameter of about 1 to 3 mm. Therefore, if $MgF_2$ is used as it is for film formation by vacuum deposition, the MgF film 16 that is not preferable in terms of a surface property may be formed by so-called splash such as bumping of a film formation material. Therefore, it is preferable to make the surface of the material uniform by melting $MgF_2$ accommodated in the hearth before forming the MgF film 16.

It is preferable that the accommodating amount (filling amount) of $MGF_2$ in the hearth is adjusted so that the height of the material surface after $MgF_2$ is melted becomes 60 to 80% of the height of the hearth.

$MgF_2$ is melted as follows: after the chamber 22 is exhausted to a predetermined pressure, $MgF_2$ in the hearth is irradiated and scanned with an electron beam emitted from the electron gun under the condition that the shutter 30 is closed, whereby $MgF_2$ is melted until granules are not recognized on the material surface in the hearth.

The pressure in the chamber 22 and the output of the electron gun when melting may be appropriately determined in accordance with the scale, performance, and the like of the film formation apparatus 20. For example, the pressure may be set to about $8\times10^{-4}$ Pa to $1\times10^{-3}$ Pa, and the output of the electron gun (in the case of 6 kV) may be set to about 60 to 150 mA.

When the chamber 22 is exhausted (after a pressure increase and fluctuation caused by degassing due to melting is settled, in the case of melting), and the inside of the chamber 22 reaches a predetermined pressure, the rotation dome 24 is rotated at a predetermined speed. At the same time, shutter 30 is opened, and an electron beam emitted from the electron gun is radiated to $MgF_2$ in the hearth, whereby the MgF film 16 is formed.

The pressure in the chamber 22 and the output of the electron gun during formation of the MgF film 16 may also be appropriately determined in accordance with the scale, performance, and the like of the film formation apparatus 20. For example, the pressure may be set to about $8\times10^{-4}$ Pa to $1\times10^{-3}$ Pa, and the output of the electron gun (for example, in the case of 6 kV) may be set to about 40 to 100 mA.

The thickness of the MgF film 16 is previously determined preferably in the above-mentioned range so that the optical component 10 has desired optical characteristics having an intended central wavelength (with the lowest reflectivity). The thickness during formation of the MgF film 16 may be controlled by a known method in vacuum deposition, using detection and the like of a film formation rate by an experiment or simulation.

The central wavelength is shifted toward a high wavelength side by about 20 nm to 140 nm by film formation of the silicon oxide film 18, which is performed in a latter stage. Therefore, in order to obtain the optical component 10 having desired optical characteristics, it is required to determine the thickness of the MgF film 16 or the silicon oxide film 18 in view of the above fact.

The thickness may be determined by simulation, using, for example, a generous-purpose calculation software of optical characteristics.

Herein, as is apparent from an example of the pressure in the system and the output of the electron gun during melting and film formation of the MgF film 16, the output energy of the electron gun is higher during melting than during film formation of the MgF film 16. More specifically, it is preferable that $MgF_2$ should be melted under the condition that a material is more likely to be evaporated compared with that during film formation.

Regarding melting, evaporating various impurities such as water deposition to a film material and removing them by gasification, as well as making the surface of $MgF_2$ accommodated in the hearth uniform to prevent bumping is also one of important objects.

Thus, by setting the energy of the electron gun during melting so that a material is more likely to be evaporated, compared with that during film formation, impurities that have not been removed during melting can be steadily prevented from being evaporated during film formation and being mixed into the MgF film 16. Consequently, the MgF film 16 of higher quality can be obtained.

The condition for melting is as follows: assuming that the power to the electron gun during melting is A, and the power to the electron gun during film formation is B, "A=Bx" and "$1 \leq x \leq 3$" (in particular, "$1.5 \leq x \leq 2$") are preferably satisfied.

When the formation of MgF film 16 is completed, and the increased pressure in the chamber 22 reaches a predetermined pressure, the hearth for the film formation of the MgF film 16 is exchanged for the hearth for the film formation of the silicon oxide film 18 in the electron gun evaporation source 28. Then, an electron beam emitted from the electron gun is radiated to $SiO_2$ in the hearth for the film formation of the silicon oxide film 18, whereby the silicon oxide film 18 is formed. The pressure in the chamber 22 and the output of the electron gun during film formation of the silicon oxide film 18 may also be appropriately determined, in accordance with the scale, performance, and the like of the film formation apparatus 20. For example, the pressure may be set to $8\times10^{-4}$ Pa to $1\times10^{-3}$ Pa, and the output of the electron gun (e.g., in the case of 6 kV) may be set to about 60 to 120 mA.

The thickness of the silicon oxide film 18 and the control of the thickness may be the same as those in the MgF film 16. During formation of the silicon oxide film 18, it is preferable that the rotation speed of the rotation dome 24 is adjusted so that the rotation dome 24 is rotated at least three times during film formation. Under the above condition, for example, the rotation speed is set to about 40 to 100 rpm.

If the amount of $SiO_2$ in the hearth is decreased by film formation, a film forming material is added, if required.

At this time, it is preferable that a portion which has been melted to become a lustrous lump is removed, and $SiO_2$ is added so that the height of the material surface becomes 60 to 80% of the height of the hearth. More preferably, after one batch of film formation, a lustrous portion is removed and a material is added without fail, whereby new $SiO_2$ is always formed on the surface in the hearth at the beginning of film formation.

Herein, the MgF film 16 and the silicon oxide film 18 are preferably formed under the condition that the measurement results of all of the temperature measuring units (temperature measuring units 32 (32a to 32d) in the chamber 22 and the temperature measuring unit of the base member 12) are low temperature states, i.e., under the condition that the entire film formation system including the base member 12 and the inner wall surfaces of the chamber 22 (excluding the film formation material evaporating portion) are set to a low temperature.

More specifically, it is preferable that the MgF film 16 and the silicon oxide film 18 are formed under the condition that the measurement result of the temperature measuring units 32 is 20° C. to 50°, particularly 20° C. to 40° C., more particularly 20° C. to 30° C., and the temperature measurement result of the base member 12 is 20° C. to 50° C., particularly 20° C. to 40° C., more particularly 20° C. to 30° C.

The inventors of the present invention studied a plastic optical component with a simple structure or a simple configuration, which has satisfactory reflection-preventing property and is excellent in mechanical strength and the like. Consequently, as described above, the inventors realized the optical component 10 of high quality that satisfies the above characteristics with a configuration in which the MgF film 16 is formed as a reflection-preventing layer on the surface of the plastic base member 12, and the silicon oxide film 18 is formed on the MgF film 16 as a protective layer.

Furthermore, in order to obtain a product having more excellent characteristics in producing the optical component 10 with such a configuration, the inventors have studied film formation conditions of each film. Consequently, the inventors have found that it is preferable to form the MgF film 16 and the silicon oxide film 18 at a low temperature.

It should be noted that the following effects can be obtained to some degree even if only the MgF film 16 is formed at a low temperature. However, if the silicon oxide film 18 is formed at high temperature, there is a possibility that a film formed is adversely affected by expansion of the base member 12. Therefore, the silicon oxide film 18 is also formed at a low temperature.

As described above, in order to obtain sufficient strength, it seems that, in general, a magnesium fluoride film is preferably formed at a high temperature of 200° C. to 400° C. Even in the case where magnesium fluoride film is formed on the plastic substrate, it seems that the temperature is preferably raised up to a heat-resistant temperature limit.

However, according to the study by the inventors of the present invention, when a magnesium fluoride film and a silicon oxide film are formed on a plastic material by vacuum deposition, as the film formation temperature is higher, adhesiveness of the film tends to decrease due to the difference in thermal expansion between the film material and the substrate. In contrast, by forming the films at a low temperature, the MgF film 16 and the like with higher adhesiveness can be formed.

Furthermore, the adhesiveness of film such as the MgF film and the silicon oxide film 18 can be made more satisfactory by setting to low the temperature of the inner wall surface of the chamber 22 (which is usually heated at all times so as to promote dehydration in the system while the chamber is opened), as well as by setting to low the temperatures of the substrate and the temperature in the film formation system.

Herein, when a magnesium fluoride film is formed at a low temperature by vacuum deposition, the mechanical strength of the MgF film 16 is lowered, compared with a case of a high-temperature treatment.

However, the optical component 10 of the present invention has the silicon oxide film 18 on the upper layer of the MgF film 16. Therefore, there is no problem in terms of the mechanical strength of the MgF film 16. Rather, considering the strength and performance of the entire optical component 10, the effect of enhanced adhesiveness obtained by forming the MgF film 16 at a low temperature is larger.

Figure 3:
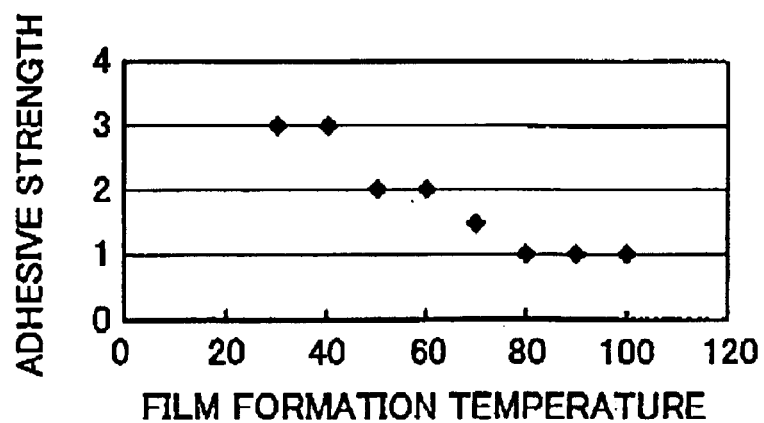
FIG. 3 is a graph illustrating characteristics of the optical component according to the first embodiment of the present invention.

FIG. 3 shows a relationship between the film formation temperature (the temperature measurement results by the temperature measuring units 32) and the film adhesion (adhesive strength) evaluated by peeling a film in a cellophane tape test, when the MgF film 16 (thickness: 100 nm) and the silicon oxide film 18 (thickness: 7 nm) are formed in accordance with the above-mentioned method, using PMMA as the base member 12 in the film formation apparatus 20 shown in FIG. 2.

In FIG. 3, the adhesive strength in the case where film peeling occurs in the first cellophane tape test is represented by "1", the adhesive strength in the case where film peeling occurs in the second, third or fourth cellophane tape test is represented by "2", and the adhesive strength in the case where film peeling does not occur even in the fourth cellophane tape test is represented by "3".

As shown in FIG. 3, as the MgF film 16 and the silicon oxide film 18 are formed at a lower temperature, the adhesiveness between the films and the base member 12 becomes more satisfactory. At a film formation temperature of 70° C., the adhesive strength of almost all the samples was at least 2; however, on rare occasion, a sample with the adhesive strength of 1 was obtained. Therefore, the adhesive strength was evaluated to be 1.5.

More specifically, by producing the optical component 10 of the first embodiment of the present invention having the above-mentioned configuration by forming the MGF film 16 and the silicon oxide film 18 under the above condition, a product of higher quality can be obtained, which has more excellent optical characteristics, film adhesiveness, mechanical strength, drug resistance, environment resistance, and the like.

Furthermore, the above-mentioned film formation method can be performed with a general vacuum deposition apparatus that does not require a special operation, facility, and the like. Therefore, the optical component of the present invention has high superiority even in terms of productivity, operability, and cost.

Next, an optical component of the second embodiment of the present invention will be described.

Figure 4:
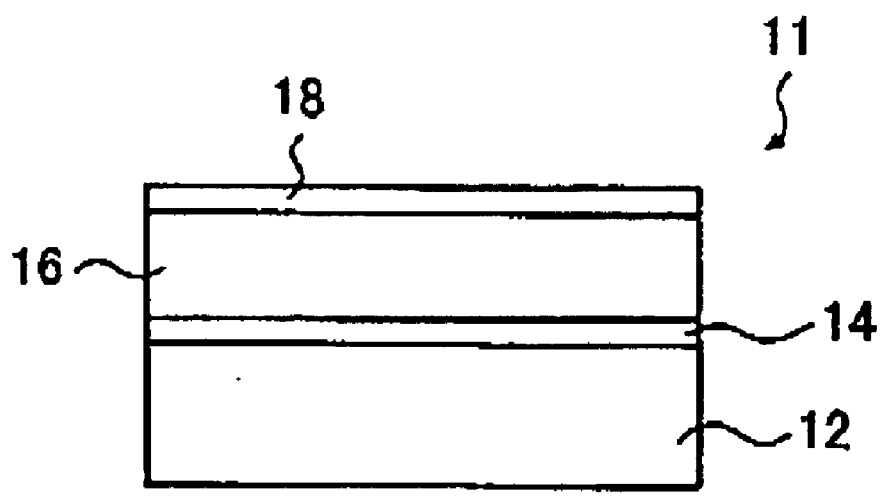
FIG. 4 is a schematic view of an example of an optical component according to a second embodiment of the present invention.

FIG. 4 is a conceptual view showing an example of the optical component of the second embodiment of the present invention.

The optical component 11 of The second embodiment of the present invention includes a base member 12 to be a film formation substrate, a second silicon oxide film 14 formed on the surface of the base member 12, an MgF film 16 formed on the surface of the second silicon oxide film 14, and a first silicon oxide film 18 formed on the surface of the MgF film 16.

The optical component 11 according to the second embodiment of the present invention has a structure and configuration similar to that of the optical component 10 according to the first embodiment of the present invention except that the former has the second silicon oxide film 14 formed between the base member 12 and the MgF film 16. Therefore, like components are identified by like reference numerals and their detailed description will be omitted. The silicon oxide film 18 formed on the surface of the MgF film 16 in the optical component 11 of the second embodiment is referred to as the first silicon oxide film 18 for the sake of distinction from the second silicon oxide film 14 formed on the surface of the base member 12. The first silicon oxide film 18 is however the same component as the silicon oxide film 18 formed on the surface of the MgF film 16 in the optical component 10 of the first embodiment.

In the second embodiment of the present invention, the base member 12 has the same composition as that of the base member 12 of the optical component 10 of the first embodiment of the present invention.

In the optical component 11 of the second embodiment of the present invention, the second silicon oxide film 14 is formed on the surface of the base member 12. The second silicon oxide film 14 is a silicon oxide film represented by General Formula: $SiO_x$ ($1.5 \leq x \leq 2$).

There is no particular limit to the thickness of the second silicon oxide film 14. However, in view of the film adhesiveness with respect to the base member 12, optical characteristics (mainly, (light) reflection-preventing property and light transparency), mechanical strength, color tint (particularly in the case of a lens), and permeability of oxygen and water, a thickness in a range of 3 nm to 50 nm, particularly 3 nm to 30 nm, and more particularly 4 nm to 12 nm is preferable.

The MgF film 16 is formed on the surface of the second silicon oxide film 14. The MgF film 16 has the same composition and thickness as those of the MgF film 16 of the optical component 10 of the first embodiment of the present invention.

Furthermore, the first silicon oxide film 18 is formed on the surface of the MgF film 16. The first silicon oxide film IS and the second silicon oxide film 14 may have the same composition and the same thickness.

In the optical component 11 of the present invention, the second silicon oxide film 14 is formed as a base layer, the MgF film 16 that functions as a reflection preventing film is formed on the second silicon oxide film 14, and the first silicon oxide film 18 that functions as a protective layer is formed on the MgF film 16. Therefore, an optical component of high quality is realized with a simple configuration and a structure, which is excellent in mechanical strength, adhesiveness of a film, drug resistance, and the like, as well as optical characteristics, which can maintain these properties even after exposure to a severe environment, and in which the advantage of the MgF film 16 is exhibited.

In the optical component 11 of the second embodiment of the present invention, the second silicon oxide film 14, the MgF film 16, and the first silicon oxide film 18 are preferably formed by vacuum deposition, in particular, at a low temperature, in the same way as in the optical component 10 of the first embodiment.

The same film formation materials as those of the optical component 10 of the first embodiment can be used.

Hereinafter, a preferable example of a method for producing the optical component 11 of the second embodiment of the present invention will be described, in which the second silicon oxide film 14, the MgF film 16, and the first silicon oxide film 18 are formed on the base member 12 by the film formation apparatus 20 shown in FIG. 2 in the same way as in the first embodiment.

In the same way as in the optical component 10 of the first embodiment, the base member 12 is set, and hearths accommodating film formation materials for the MgF film 16 and the second and first silicon oxide films 14 and 18 are set. $MgF_2$ accommodated in the hearth set in the electron gun evaporation source 28 is preferably melted as described in the first embodiment.

Thereafter, the chamber 22 is exhausted (after a pressure increase and fluctuation caused by degassing due to melting is settled, in the case of melting), and when the inside of the chamber 22 reaches a predetermined pressure, the rotation dome 24 is rotated at a predetermined speed, and the shutter 30 is opened. Then, the hearth for the film formation of the MgF film 16 is exchanged for the hearth for the film formation of the second silicon oxide film 14 in the electron gun evaporation source 28, and an electron beam emitted from the electron gun is radiated to $SiO_2$ in the hearth for the film formation of the second silicon oxide film 14, whereby the second silicon oxide film 14 is formed. The pressure in the chamber 22 and the output of the electron gun during formation of the second silicon oxide film 14 may also be appropriately determined in accordance with the scale, performance, and the like of the film formation apparatus 20. For example, the pressure may be set to about $8 \times 10^{-4}$ Pa to $1 \times 10^{-3}$ Pa, and the output of the electron gun (for example, in the case of 6 kV) may be about 60 to 120 mA. The thickness during film formation may be controlled by a known method in vacuum deposition, using detection and the like of a film formation rate by an experiment or simulation.

When the second silicon oxide film 14 is formed, and the inside of the chamber 22 is increased to a predetermined pressure, the hearth for the film formation of the second silicon oxide film 14 is exchanged for the hearth for the film formation of the MgF film 16 in the electron gun evaporation source 28, and an electron beam emitted from the electron gun is radiated to $MgF_2$ in the hearth for the film formation of the MgF film 16, whereby the MgF film 16 is formed. The subsequent processes are the same as those in the case of producing the optical component 10 of the first embodiment. Therefore, the description thereof will be omitted here.

Figure 5:
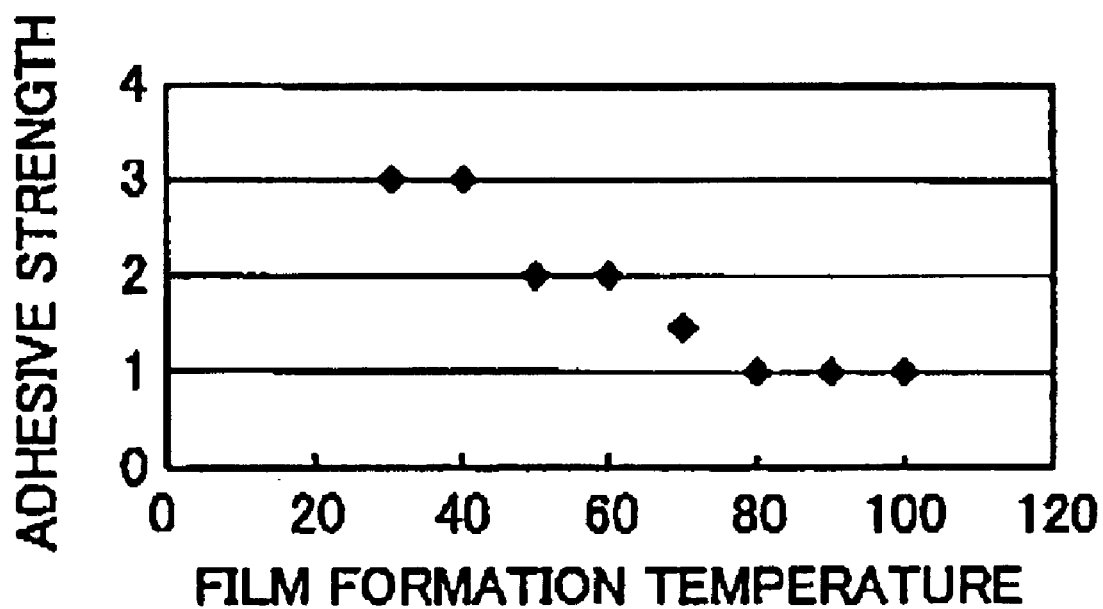
FIG. 5 is a graph illustrating the characteristics of the optical component according to the second embodiment of the present invention.

FIG. 5 shows a relationship between the film formation temperature (the temperature measurement results by the temperature measuring unit 32) and the film adhesion (adhesive strength) evaluated by peeling a film in a cellophane tape test, when the second silicon oxide film 14 (thickness: 7 nm), the MgF film 16 (thickness: 100 nm), and the first silicon oxide film 18 (thickness: 7 nm) are formed in accordance with the above-mentioned method, using PMMA as the base member 12 in the film formation apparatus 20 shown in FIG. 2.

In FIG. 5, similarly to FIG. 3, the adhesive strength in the case where film peeling occurs when performing the cellophane tape test once is represented by "1", the adhesive strength in the case where film peeling occurs when performing the cellophane tape test two, three or four times is represented by "2", and the adhesive strength in the case where film peeling does not occur even in the cellophane tape test four times is represented by "3".

As shown in FIG. 5, as the second silicon oxide film 14, the MgF film 16, and the first silicon oxide film 18 are formed at a lower temperature, the adhesiveness between the films and the base member 12 becomes more satisfactory. At a film formation temperature of 70° C., the adhesive strength of almost all the samples was at least 2; however, on rare occasion, a sample with the adhesive strength of 1 was obtained. Therefore, the adhesive strength was evaluated to be 1.5.

More specifically, by producing the optical component 11 of the second embodiment of the present invention having the above-mentioned configuration by forming the second silicon oxide film 14, the MGF film 16, and the first silicon oxide film 18 under the above condition, a product of higher quality can be obtained, which has more excellent optical characteristics, film adhesiveness, mechanical strength, drug resistance, environment resistance, and the like.

Furthermore, the above-mentioned film formation method can be performed with a general vacuum deposition apparatus that does not require a special operation, facility, and the like. Therefore, the optical component of the present invention has high superiority even in terms of productivity, operability, and cost.

As described above, the optical component of the present invention has been described in detail. It is understood that the present invention is not limited to the above-mentioned embodiments, and various alterations and modifications may be made in a scope without departing from the spirit of the present invention.

Thus, as described in detail, according to the present invention, an optical component can be realized, which is excellent in film adhesiveness, mechanical strength, drug resistance, environment resistance, and the like, as well as optical characteristics, and which is also excellent in productivity, film formation operability, cost, and the like.

EXAMPLES

Hereinafter, the present invention will be described in more detail by way of specific examples of the optical component 10 according to the present invention.

Example 1

First, the specific examples of the optical component 10 according to the first embodiment of the present invention will be described.

Sample No. 1

The MgF film 16 and the silicon oxide film 18 were formed on the base member 12 by using the film formation apparatus 20 shown in FIG. 2, whereby the optical component 10 of the first embodiment of the present invention was produced.

The following operation was performed so that the measurement results by all the temperature measuring units 32 and the temperature measuring unit of the base member 12 became 22° C. to 27° C. from the beginning of melting to the end of film formation of the silicon oxide film 18. Furthermore, an electron gun of 6 kV was placed in the electron gun evaporation source 28.

First, a lens made of PMMA (VH 001, produced by Mitsubishi Rayon Co., Ltd.) was set as the base member 12 at a predetermined position of the rotation dome 24.

Furthermore, a hearth accommodating $MgF_2$ (n=1.35 to 1.4) and a hearth accommodating $SiO_2$ (n=1.45 to 1.48) were set at a predetermined positions of the electron gun evaporation source 28. The accommodated amounts of both the film formation materials were adjusted so that the height of the material surface (after melting in the case of $MgF_2$) became 70% of the height of the hearth.

After the chamber 22 was closed, the chamber was exhausted to a pressure of $8\times10^{-4}$ Pa. At this time, $MgF_2$ in the hearth was irradiated and scanned with an electron beam from the electron gun at a current value of 90 mA while the shutter 30 was closed, and the melting of $MgF_2$ was performed. The melting was performed in accordance with previously performed simulation until granules were not recognized on the surface of the material and the surface became uniform.

When the pressure in the chamber 22 after the melting is increased up to $8\times10^{-4}$ Pa, the rotation dome 24 was rotated at 70 rpm, and the shutter 30 was opened. Thus, an electron beam was emitted from the electron gun at a current value of 55 mA, and radiated to $MgF_2$ in the hearth, whereby the MgF film 16 (thickness: about 100 nm) was formed on the surface of the base member 12 by vacuum deposition.

When the pressure in the chamber 22 became $1\times10^{-3}$ Pa after the MgF film 16 was formed, the position of the hearth in the electron gun evaporation source 28 was changed, and an electron beam was radiated to $SiO_2$ in the hearth from the electron gun at a current value of 80 mA, whereby the silicon oxide film 18 (thickness: about 7 nm) was formed on the surface of the MgF film 16 to produce the optical component 10 of the first embodiment of the present invention.

The thickness of both films were determined by simulation using generous-purpose calculation software of optical characteristics so that the central wavelength of the optical component 10 became 600 nm.

Sample Nos. 2 to 6

An optical component was produced in the same way as in Sample No. 1 above, except that only the MgF film 16 was formed (Sample No. 2; comparative example).

An optical component was produced in the same way as in Sample No. 1 above, except that only the silicon oxide film 18 was formed (Sample No. 3; comparative example).

The optical component 10 was produced in the same way as in Sample No. 1 above, except that the temperature of the film formation apparatus 20 was controlled so that the measurement results by the temperature measuring units 32 became 70° C. to 80° C. (Sample No. 4).

The optical component 10 was produced in the same way as in Sample No. 1 above, except that the melting of $MgF_2$ was not performed (Sample No. 5).

The optical component 10 was produced in the same way as in Sample No. 1, except that the thickness of the silicon oxide film 18 was set to 2 nm (Sample No. 6).

The thickness of the silicon oxide film 18 of Sample No. 3 was set to about 100 nm so that the central wavelength of the optical component became 600 nm.

Sample Nos. 7 to 12

Optical components were produced in the same way as in Sample Nos. 1 to 6 above, except that the base member 12 was changed to a substrate made of PC (L1225ZL-100, produced by Teijin Kasei Co. Ltd.).

Sample No. 7 corresponds to Sample No. 1 above. Sample No. 8 corresponds to Sample No. 2 above (only the MgF film 16; comparative example). Sample No. 9 corresponds to Sample No. 3 above (only the silicon oxide film 18; comparative example). Sample No. 10 corresponds to Sample No. 4 above (temperature: 70° C. to 80° C.). Sample No. 11 corresponds to Sample No. 5 above (no melting). Sample No. 12 corresponds to Sample No. 6 above (silicon oxide film: 2 nm).

Sample Nos. 13 to 18

Optical components were produced in the same way as in Sample Nos. 1 to 6 above, except that the base member 12 was changed to a substrate made of a cycloolefin polymer (Zeonex, produced by Nippon Zeon Co., Ltd. (Zeon Corporation)).

Sample No. 13 corresponds to Sample No. 1 above. Sample No. 14 corresponds to Sample No. 2 above (only the MgF film 16; comparative example). Sample No. 15 corresponds to Sample No. 3 above (only the silicon oxide film 18; comparative example). Sample No. 16 corresponds to Sample No. 4 above (temperature: 70° C. to 80° C.). Sample No. 17 corresponds to Sample No. 5 above (no melting). Sample No. 18 corresponds to Sample No. 6 above (silicon oxide film: 2 nm).

By doing as above, the 600 pieces of the optical components of one batch every sample of Sample Nos. 1 to 18 were produced. The respective optical components of Sample Nos. 1 to 18 thus produced were tested for optical characteristics, outer appearance, film adhesiveness, abrasion resistance, and drug resistance. Each test was performed as follows.

Optical Characteristics

Thirty optical components were selected at random from those of one batch (600 pieces), and reflectivity spectral characteristics of the surface (film formation surface) of each optical component was measured by a reflectivity measuring unit.

A sample in which all the optical components had a reflectivity at the central wavelength of less than 2% was evaluated to be ○, and a sample in which there was at least one optical component having a reflectivity at the central wavelength of 2% or more was evaluated to be X.

Outer Appearance

The surfaces of the optical components thus produced were irradiated with light to check foreign matter such as dust. An optical component in which at least one foreign matter of 0.1 mm or more was checked was determined to be an NG (bad quality) product.

A sample with a yield of at least 95% in one batch was evaluated to be ◉. A sample with a yield of 90% to 94% in one batch was evaluated to be ○. A sample with a yield of 80% to 89% in one batch was evaluated to be Δ. A sample with a yield of 79% or less in one batch was evaluated to be X.

Adhesiveness Test

Thirty optical components were selected at random from those of one batch produced, and cellophane tape (No. 405, produced by Nichiban Co., Ltd.) was firmly sticked to the respective surfaces. Peeling of a film when the tape was peeled instantly in a direction vertical to the film surface was checked visually.

A sample in which peeling of a film was not recognized in all the optical components was evaluated to be ○. A sample in which there was at least one optical component that was subjected to partial peeling of a film was evaluated to be Δ. A sample in which there was at least one optical component that was subjected to almost complete peeling of a film was evaluated to be X. A sample in which no peeling of a film was recognized in all the optical components even after the same test was repeated 10 times was particularly evaluated to be ◉.

Abrasion Resistance Test

Thirty optical components were selected at random from those of one batch produced. Silbon paper was placed on the respective surfaces of the optical components. The surfaces were rubbed with Silbon paper 50 times in a reciprocated manner under a load of 300 g, and whether or not a base film (MgF film 16) was exposed was checked visually.

A sample in which exposure of a base film was not recognized in all the optical components was evaluated to be ○. A sample in which there was at least one optical component in which exposure of a base film was partially recognized was evaluated to be Δ. A sample in which there was at least one optical component in which a film was almost completely peeled was evaluated to be X. A sample in which no peeling of a film was recognized in all the optical components even after the same test was repeated 10 times was particularly evaluated to be ◉.

Drug Resistance Test

Thirty optical components were selected at random from those of One batch produced. Silbon paper containing ethyl alcohol on its surface was placed on the respective surfaces of the optical components. The surfaces were rubbed with Silbon paper 50 times in a reciprocated manner under a load of 300 g, and whether or not a base film (MgF film 16) was exposed was checked visually.

A sample in which exposure of a base film was not recognized in all the optical components was evaluated to be ○. A sample in which there was at least one optical component in which exposure of a base film was partially recognized was evaluated to be Δ. A sample in which there was at least one optical component in which a film was almost completely peeled was evaluated to be X. A sample in which no peeling of a film was recognized in all the optical components even after the same test was repeated 10 times was particularly evaluated to be ◉.

Furthermore, in order to check environment resistance of each optical component, after each optical component was left to stand at high humidity, after each optical component was provided with thermal shock, and after each optical component was allowed to stand at high temperature, each test of outer appearance, adhesiveness, abrasion resistance, and drug resistance was performed in the same way as in the above.

In the above-mentioned test, each optical sample was allowed to stand at high humidity for 100 hours in an environment of 40° C. at 80% RH. Each optical sample was provided with heat shock by repeating nine times the cycle of changing a temperature in a range of −20° C. to 60° C. in 8 hours. Each optical component was allowed to stand at high temperature for 100 hours in a dry environment of 60° C.

All test results are shown in the following Table 1.1 and 1.2.

The overall evaluation was as follows: a sample in which all the optical components were ◉ was evaluated to be ◉; a sample in which at least one optical component was ○ and the remainder were ◉ was evaluated to be ○; a sample in which at least one optical component was Δ and the remainder were ◉ or ○ was evaluated to be Δ; and a sample in which at least one optical component was X was evaluated to be X.

TABLE 1.1

| | | | | Initial characteristics | | | |
|---|---|---|---|---|---|---|---|
| No. | Substrate | Layer composition | Optical characteristics | OA | AD | AR | DR |
| 1 | PMMA | MgF—SiO | ○ | ◉ | ◉ | ◉ | ◉ |
| 2 | | MgF | ○ | ◉ | ○ | Δ | Δ |
| 3 | | SiO | X | ◉ | ◉ | ◉ | ◉ |
| 4 | | MgF—SiO | ○ | ◉ | ○ | ◉ | ◉ |
| 5 | | MgF—SiO | ○ | ○ | ◉ | ◉ | ◉ |
| 6 | | MgF—SiO | ○ | ◉ | ◉ | ○ | ○ |
| 7 | PC | MgF—SiO | ○ | ◉ | ◉ | ◉ | ◉ |
| 8 | | MgF | ○ | ◉ | ○ | X | X |
| 9 | | SiO | X | ◉ | ◉ | ◉ | ◉ |
| 10 | | MgF—SiO | ○ | ◉ | ○ | ○ | ○ |
| 11 | | MgF—SiO | ○ | ○ | ◉ | ◉ | ◉ |
| 12 | | MgF—SiO | ○ | ◉ | ◉ | ○ | ○ |

TABLE 1.1-continued

| No. | Substrate | Layer composition | Optical characteristics | OA | AD | AR | DR |
|---|---|---|---|---|---|---|---|
| 13 | Polyolefin | MgF—SiO | ○ | ◎ | ◎ | ◎ | ◎ |
| 14 | | MgF | ○ | ◎ | ○ | △ | △ |
| 15 | | SiO | X | ◎ | ◎ | ◎ | ◎ |
| 16 | | MgF—SiO | ○ | ◎ | ○ | ◎ | ◎ |
| 17 | | MgF—SiO | ○ | ○ | ◎ | ◎ | ◎ |
| 18 | | MgF—SiO | ○ | ◎ | ◎ | ○ | ○ |

TABLE 1.2

| | Environmental resistance | | | | | | | | | | | | |
|---|---|---|---|---|---|---|---|---|---|---|---|---|---|
| | Stand at high humidity | | | | Thermal shock | | | | Stand at high temperature | | | | |
| No | OA | AD | AR | DR | OA | AD | AR | DR | OA | AD | AR | DR | Overall |
| 1 | ◎ | ◎ | ◎ | ◎ | ◎ | ◎ | ◎ | ◎ | ◎ | ◎ | ◎ | ◎ | ◎ |
| 2 | ◎ | ○ | X | X | ◎ | ○ | X | X | ◎ | ○ | X | X | X |
| 3 | ◎ | ◎ | ◎ | ◎ | ◎ | ◎ | ◎ | ◎ | ◎ | ◎ | ◎ | ◎ | X |
| 4 | ◎ | ○ | ○ | ○ | ◎ | ○ | ○ | ○ | ◎ | ○ | ○ | ○ | ○ |
| 5 | ○ | ◎ | ◎ | ◎ | ○ | ◎ | ◎ | ◎ | ○ | ◎ | ◎ | ◎ | ○ |
| 6 | ◎ | ◎ | ◎ | ◎ | ◎ | ◎ | ◎ | ◎ | ◎ | ◎ | ◎ | ◎ | ○ |
| 7 | ◎ | ◎ | ◎ | ◎ | ◎ | ◎ | ◎ | ◎ | ◎ | ◎ | ◎ | ◎ | ◎ |
| 8 | ◎ | ○ | X | X | ◎ | ○ | X | X | ◎ | ○ | X | X | X |
| 9 | ◎ | ◎ | ◎ | ◎ | ◎ | ◎ | ◎ | ◎ | ◎ | ◎ | ◎ | ◎ | X |
| 10 | ◎ | ○ | ○ | ○ | ◎ | ○ | ○ | ○ | ◎ | ○ | ○ | ○ | ○ |
| 11 | ○ | ◎ | ◎ | ◎ | ○ | ◎ | ◎ | ◎ | ○ | ◎ | ◎ | ◎ | ○ |
| 12 | ◎ | ◎ | ○ | ○ | ◎ | ◎ | ○ | ○ | ◎ | ◎ | ○ | ○ | ○ |
| 13 | ◎ | ◎ | ◎ | ◎ | ◎ | ◎ | ◎ | ◎ | ◎ | ◎ | ◎ | ◎ | ◎ |
| 14 | ◎ | ○ | X | X | ◎ | ○ | X | X | ◎ | ○ | X | X | X |
| 15 | ◎ | ◎ | ◎ | ◎ | ◎ | ◎ | ◎ | ◎ | ◎ | ◎ | ◎ | ◎ | X |
| 16 | ◎ | ○ | ○ | ○ | ◎ | ○ | ○ | ○ | ◎ | ○ | ○ | ○ | ○ |
| 17 | ○ | ◎ | ◎ | ◎ | ○ | ◎ | ◎ | ◎ | ○ | ◎ | ◎ | ◎ | ○ |
| 18 | ◎ | ◎ | ○ | ○ | ◎ | ◎ | ◎ | ◎ | ◎ | ◎ | ◎ | ◎ | ◎ |

OA Outer appearance
AB Abrasion resistance
AD Adhesiveness
DR Drug resistance

As shown in Table 1.1 and 1.2, the optical component according to the first embodiment of the present invention which includes the MgF film 16 (reflection preventing film) and the silicon oxide film 18 (protective film) formed on the base member 12 in this order is excellent in all of the optical characteristics, outer appearance, film adhesiveness, abrasion resistance, and drug resistance. Furthermore, the optical component of the first embodiment is an optical component of high quality that is excellent in environment resistance and capable of maintaining the above-mentioned characteristics even after the optical component is exposed to a severe environment.

In particular, the optical components (Sample Nos. 1, 7, and 13) of the present invention produced by the above-mentioned preferable production method (film formation method) are those of higher quality, which are excellent in all of the optical characteristics, outer appearance, film adhesiveness, abrasion resistance, drug resistance, and environment resistance.

The effect of the present invention is apparent from the above results.

Example 2

Next, specific examples of the optical component 11 according to the second embodiment of the present invention will be described.

Sample No. 1

The second silicon oxide film 14, the MgF film 16, and the first silicon oxide film 18 were formed on the base member 12 by using the film formation apparatus 20 shown in FIG. 2, whereby the optical component 11 of the second embodiment of the present invention was produced.

The following operation was performed so that the measurement results by all the temperature measuring units 32 and the temperature measuring unit of the base member 12 became 22° C. to 27° C. from the beginning of melting to the end of film formation of the first silicon oxide film 18, in the same way as in Example 1. Furthermore, an electron gun of 6 kV was placed in the electron gun evaporation source 28.

The processes up to the completion of melting of $MgF_2$ were the same as those in Example 1.

When the pressure in the chamber 22 after melting increased up to $1 \times 10^{-3}$ Pa, the rotation dome 24 was rotated at 70 rpm. The position of the hearth in the electron gun evaporation source 28 was changed from the hearth for melting $MgF_2$ to the hearth for melting $SiO_2$ and the shutter 30 was opened. Thus, an electron beam was emitted from the electron gun at a current value of 80 mA, and radiated to $SiO_2$, whereby the second silicon oxide film 14 (thickness: about 7 nm) was formed on the surface of the base member 12 by vacuum deposition.

When the pressure in the chamber 22 increased up to 8×10⁻⁴ Pa after the second silicon oxide film 14 was formed, the position of the hearth in the electron gun evaporation source 28 was changed from the hearth for melting SiO₂ to the hearth for melting MgF₂, and an electron beam was emitted from the electron gun at a current value of 55 mA and radiated to MgF₂ in the hearth, whereby the MgF film 16 (thickness: about 100 nm) was formed on the surface of the second silicon oxide film 14 by vacuum deposition.

When the pressure in the chamber 22 became 1×10⁻³ Pa after the MgF film 16 was formed, the position of the hearth in the electron gun evaporation source 28 was changed from the hearth for melting MgF₂ to the hearth for melting SiO₂, and an electron beam was emitted from the electron gun at a current value of 80 mA and radiated to SiO₂ in the hearth, whereby the first silicon oxide film 18 (thickness: about 7 nm) was formed on the surface of the MgF film 16 by vacuum deposition to produce the optical component 11 of the second embodiment of the present invention.

The thickness of the MgF film 16 and the first silicon oxide film 18 was determined by simulation using generous-purpose calculation software of optical characteristics so that the central wavelength of the optical component 11 became 600 nm.

Sample Nos. 2 to 6

An optical component was produced in the same way as in Sample No. 1 above, except that films to be formed have a two-layer configuration of only the second silicon oxide film 14 and the MgF film 16 (Sample No. 2; comparative example).

An optical component was produced in the same way as in Sample No. 1 above, except that a film to be formed has one-layer configuration of only the silicon oxide film (Sample No. 3; comparative example).

An optical component was produced in the same way as in Sample No. 1 above, except that the temperature of the film formation apparatus 20 was controlled so that the measurement results by all the temperature measuring units 32 became 70° C. to 80° C. (Sample No. 4).

An optical component was produced in the same way as in Sample No. 1 above, except that the melting of MgF₂ was not performed (Sample No. 5).

An optical component was produced in the same way as in Sample No. 1 above, except that the thickness of the first silicon oxide film 18 was set to 2 nm (Sample No. 6).

The thickness of the silicon oxide film of Sample No. 3 was determined (about 100 nm) so that the central wavelength of the optical component became 600 nm.

Samples Nos. 7 to 12

Optical components were produced in the same way as in Sample Nos. 1 to 6 above, except that the base member 12 was changed to a substrate made of PC (L1225ZL-100, produced by Teijin Kasei Co., Ltd.).

Sample No. 7 corresponds to Sample No. 1 above. Sample No. 8 corresponds to Sample No. 2 above (only the second silicon oxide film 14 and the MgF film 16; comparative example). Sample No. 9 corresponds to Sample No. 3 above (only the silicon oxide film; comparative example). Sample No. 10 corresponds to Sample No. 4 above (temperature: 70° C. to 80° C.). Sample No. 11 corresponds to Sample No. 5 above (no melting). Sample No. 12 corresponds to Sample No. 6 above (first silicon oxide film 18: 2 nm).

Sample Nos. 13 to 18

Optical components were produced in the same way as in Sample Nos. 1 to 6 above, except that the base member 12 was changed to a substrate made of a cycloolefin polymer (Zeonex, produced by Nippon Zeon, Co., Ltd.).

Sample No. 13 corresponds to Sample No. 1 above. Sample No. 14 corresponds to Sample No. 2 above (only the second silicon oxide film 14 and the MgF film 16; comparative example). Sample No. 15 corresponds to Sample No. 3 above (only the silicon oxide film; comparative example). Sample No. 16 corresponds to Sample No. 4 above (temperature: 70° C. to 80° C.). Sample No. 17 corresponds to Sample No. 5 above (no melting). Sample No. 18 corresponds to Sample No. 6 above (first silicon oxide film 18: 2 nm).

By doing as above, the 600 pieces of the optical components of one batch every sample of Sample Nos. 1 to 18 were produced. The respective optical components of Sample Nos. 1 to 18 thus produced were tested for optical characteristics, outer appearance, film adhesiveness, abrasion resistance, and drug resistance.

Furthermore, in order to checked environment resistance of each optical component, after each optical component was allowed to stand at high humidity, after each optical component was provided with heat shock, and after each optical component was allowed to stand at high temperature, each test of outer appearance, adhesiveness, abrasion resistance, and drug resistance was performed in the same way as in Example 1. Each test method is the same as that in Example 1.

Table 2.1 and 2.2 shows all the test results.

In the same way as in Table 1.1 and 1.2, the overall evaluation was as follows: a sample in which all the optical components were ⊚ was evaluated to be ⊚; a sample in which at least one optical component was ○ and the remainder were ⊚ was evaluated to be ○; a sample in which at least one optical component was Δ and the remainder were ⊚ or ○ was evaluated to be Δ; and a sample in which at least one optical component was X was evaluated to be X.

TABLE 2.1

| No | Substrate | Layer composition | Optical characteristics | Initial characteristics | | | |
|----|-----------|-------------------|------------------------|-----|-----|-----|-----|
| | | | | OA | AD | AR | DR |
| 1 | PMMA | SiO—MgF—SiO | ○ | ⊚ | ⊚ | ⊚ | ⊚ |
| 2 | | SiO—MgF | ○ | ⊚ | ○ | X | X |
| 3 | | SiO | X | ⊚ | ⊚ | ⊚ | ⊚ |
| 4 | | SiO—MgF—SiO | ○ | ⊚ | ○ | ⊚ | ⊚ |
| 5 | | SiO—MgF—SiO | ○ | ○ | ⊚ | ⊚ | ⊚ |
| 6 | | SiO—MgF—SiO | ○ | ⊚ | ⊚ | ○ | ○ |
| 7 | PC | SiO—MgF—SiO | ○ | ⊚ | ⊚ | ⊚ | ⊚ |
| 8 | | SiO—MgF | ○ | ⊚ | ○ | X | X |
| 9 | | SiO | X | ⊚ | ⊚ | ⊚ | ⊚ |

TABLE 2.1-continued

| No | Substrate | Layer composition | Optical characteristics | OA | AD | AR | DR |
|---|---|---|---|---|---|---|---|
| 10 | | SiO—MgF—SiO | ○ | ◎ | ○ | ○ | ○ |
| 11 | | SiO—MgF—SiO | ○ | ○ | ◎ | ◎ | ◎ |
| 12 | | SiO—MgF—SiO | ○ | ◎ | ◎ | ○ | ○ |
| 13 | Polyolefin | SiO—MgF—SiO | ○ | ◎ | ◎ | ◎ | ◎ |
| 14 | | SiO—MgF | ○ | ◎ | ○ | X | X |
| 15 | | SiO | X | ◎ | ◎ | ◎ | ◎ |
| 16 | | SiO—MgF—SiO | ○ | ◎ | ○ | ◎ | ◎ |
| 17 | | SiO—MgF—SiO | ○ | ○ | ◎ | ◎ | ◎ |
| 18 | | SiO—MgF—SiO | ○ | ◎ | ◎ | ○ | ○ |

TABLE 2.2

| | Environmental resistance | | | | | | | | | | | | |
|---|---|---|---|---|---|---|---|---|---|---|---|---|---|
| | Stand at high humidity | | | | Thermal shock | | | | Stand at high temperature | | | | |
| No | OA | AD | AR | DR | OA | AD | AR | DR | OA | AD | AR | DR | Overall |
| 1 | ◎ | ◎ | ◎ | ◎ | ◎ | ◎ | ◎ | ◎ | ◎ | ◎ | ◎ | ◎ | ◎ |
| 2 | ◎ | Δ | X | X | ◎ | ○ | X | X | ◎ | ○ | X | X | X |
| 3 | ◎ | ◎ | ◎ | ◎ | ◎ | ◎ | ◎ | ◎ | ◎ | ◎ | ◎ | ◎ | X |
| 4 | ◎ | ○ | ○ | ○ | ◎ | ○ | ○ | ○ | ◎ | ○ | ○ | ○ | ○ |
| 5 | ○ | ◎ | ◎ | ◎ | ○ | ◎ | ◎ | ◎ | ○ | ◎ | ◎ | ◎ | ○ |
| 6 | ◎ | ◎ | ○ | ○ | ◎ | ◎ | ○ | ○ | ◎ | ◎ | ○ | ○ | ○ |
| 7 | ◎ | ◎ | ◎ | ◎ | ◎ | ◎ | ◎ | ◎ | ◎ | ◎ | ◎ | ◎ | ◎ |
| 8 | ◎ | Δ | X | X | ◎ | ○ | X | X | ◎ | ○ | X | X | X |
| 9 | ◎ | ◎ | ◎ | ◎ | ◎ | ◎ | ◎ | ◎ | ◎ | ◎ | ◎ | ◎ | X |
| 10 | ◎ | ○ | ○ | ○ | ◎ | ○ | ○ | ○ | ◎ | ○ | ○ | ○ | ○ |
| 11 | ○ | ◎ | ◎ | ◎ | ○ | ◎ | ◎ | ◎ | ○ | ◎ | ◎ | ◎ | ○ |
| 12 | ◎ | ◎ | ○ | ○ | ◎ | ◎ | ○ | ○ | ◎ | ◎ | ○ | ○ | ○ |
| 13 | ◎ | ◎ | ◎ | ◎ | ◎ | ◎ | ◎ | ◎ | ◎ | ◎ | ◎ | ◎ | ◎ |
| 14 | ◎ | Δ | X | X | ◎ | ○ | X | X | ◎ | ○ | X | X | X |
| 15 | ◎ | ◎ | ◎ | ◎ | ◎ | ◎ | ◎ | ◎ | ◎ | ◎ | ◎ | ◎ | X |
| 16 | ◎ | ○ | ○ | ○ | ◎ | ○ | ○ | ○ | ◎ | ○ | ○ | ○ | ○ |
| 17 | ○ | ◎ | ◎ | ◎ | ○ | ◎ | ◎ | ◎ | ○ | ◎ | ◎ | ◎ | ○ |
| 18 | ◎ | ◎ | ○ | ○ | ◎ | ◎ | ○ | ○ | ◎ | ◎ | ○ | ○ | ○ |

OA Outer appearance
AB Abrasion resistance
AD Adhesiveness
DR Drug resistance

As shown in Table 2.1 and 2.2 above, the optical component according to the second embodiment of the present invention which includes the second silicon oxide film 14 (base layer), the MgF film 16 (reflection preventing film), and the first silicon oxide film 18 (protective film) formed on the base member 12 in this order is excellent in all of the optical characteristics, outer appearance, film adhesiveness, abrasion resistance, and drug resistance. Furthermore, the optical component of the second embodiment is a component of high quality that is excellent in environment resistance and capable of maintaining the above-mentioned characteristics even after the optical component is exposed to a severe environment.

In particular, the optical components (Sample Nos. 1, 7, and 13) of the present invention produced by the above-mentioned preferable production method (film formation method) are those of higher quality, which are excellent in all of the optical characteristics, outer appearance, film adhesiveness, abrasion resistance, drug resistance, and environment resistance.

The effect of the present invention is apparent from the above results.

What is claimed is:

1. An optical component, comprising:
   a film formation substrate made of plastic;
   a magnesium fluoride film formed directly on a surface of said film formation substrate; and
   a first silicon oxide film formed on said magnesium fluoride film.

2. The optical component according to claim 1, wherein said film formation substrate is one selected from the group consisting of a lens, a filter, a screen, a polymer film, and an optical substrate.

3. The optical component according to claim 1, wherein a thickness of said magnesium fluoride film is in a range of 40 nm to 160 nm.

4. The optical component according to claim 1, wherein a thickness of said first silicon oxide film is in a range of 3 nm to 50 nm.

5. The optical component according to claim 1, wherein said magnesium fluoride film is made of MgF2 and said first silicon oxide film is made of SIO2.

6. The optical component according to claim 1, wherein a film formation material for said magnesium fluoride film has a refractive index "n" of 1.3 to 1.4, and a film formation material for said first silicon oxide film has a refractive index "a" of 1.4 to 1.5.

7. The optical component according to claim 1, wherein said magnesium fluoride film and said first silicon oxide film are formed by vacuum deposition, respectively.

8. The optical component according to claim 1, wherein said magnesium fluoride film and said first silicon oxide film arc fanned by vacuum deposition at a low temperature, respectively.

9. The optical component according to claim 8, wherein said low temperature is in a range of 20° C. to 50° C.

10. The optical component of claim 1, wherein the film formation substrate is at least one selected from the group consisting of: polymethylmethacrylate, polycarbonate, polyolefine, polyvinyl chloride, and polystyrene.

11. The optical component of claim 1, wherein the first silicon oxide film is represented by the general formula of: SiOx wherein x is a value that is greater than or equal to 1.5 but less than or equal to 2.

12. An optical component comprising:
a film formation substrate made of plastic;
a second silicon oxide film formed as a first on a surface of said film formation substrate
a magnesium fluoride film formed as a second layer directly on a surface of said second silicon oxide film; and
a first silicon oxide film formed as a third layer on said magnesium fluoride film.

13. The optical component according to claim 12, wherein said film formation substrate is one selected from the group consisting of a lens, a filter, a screen, a polymer film, and an optical substrate.

14. The optical component according to claim 12, wherein a thickness of said magnesium fluoride film is in a range of 40 nm to 160 nm.

15. The optical component according to claim 12, wherein a thickness of said first and second silicon oxide films are in a range of 3 nm to 50 nm.

16. The optical component according to claim 12, wherein said magnesium fluoride film is made of MgF2 and said first and second silicon oxide films are made of SiO2.

17. The optical component according to claim 12, wherein a film formation material for said magnesium fluoride film has a refractive index "n" of 1.3 to 1.4, and a film formation material for said first and second silicon oxide films have a refractive index "n" of 1.4 to 1.5.

18. The optical component according to claim 12, wherein said magnesium fluoride film, said first and second silicon oxide films are formed by vacuum deposition, respectively.

19. The optical component according to claim 12, wherein said magnesium fluoride film, said first and second silicon oxide films are formed by vacuum deposition at a low temperature, respectively.

20. The optical component according to claim 19, wherein said low temperature is in a range of 20° C. to 50° C.

21. The optical component of claim 12, wherein the second silicon oxide film is represented by the general formula of: SiOx wherein x is value that is greater than or equal to 1.5 but less than or equal to 2.

22. The optical component of claim 12, wherein the film formation substrate is at least one selected from the group consisting of: polymethylmethacrylate, polycarbonate, polyolefine, polyvinyl chloride, and polystyrene.

* * * * *

UNITED STATES PATENT AND TRADEMARK OFFICE
CERTIFICATE OF CORRECTION

PATENT NO. : 6,863,965 B2
DATED : March 8, 2005
INVENTOR(S) : Jun Fujinawa et al.

It is certified that error appears in the above-identified patent and that said Letters Patent is hereby corrected as shown below:

Column 20,
Line 63, change "is made of MgF2" to -- $MgF_2$ --;
Line 64, change "made of "SIO2" to -- made of $SiO_2$ --.

Column 21,
Lines 1-2, change "a refractive index "a" of 1.4 to 1.5" to -- a refractive index "n" of 1.4 to 1.5 --.
Lines 7-8, change "said first silicon oxide film arc fanned" to -- said first silicon oxide film are formed --.
Line 22, change "as a first on a surface" to -- as a first layer on a surface --.

Column 22,
Line 8, change "is made of "MgF2" to -- is made of $MgF_2$ --;
Line 9, change "made of "SIO2" to -- $SiO_2$ --.

Signed and Sealed this

Twenty-third Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,863,965 B2  Page 1 of 1
APPLICATION NO. : 10/151173
DATED : March 8, 2005
INVENTOR(S) : Jun Fujinawa et al.

It is certified that error appears in the above-identified patent and that said Letters Patent is hereby corrected as shown below:

Column 20, claim 5, line 63, change "$MgF_2$" to -- is made of $MgF_2$ --;

Signed and Sealed this

Twenty-sixth Day of February, 2008

JON W. DUDAS
*Director of the United States Patent and Trademark Office*